United States Patent
Yoshida et al.

(10) Patent No.: US 11,056,362 B2
(45) Date of Patent: Jul. 6, 2021

(54) WAFER HEATING AND HOLDING MECHANISM AND METHOD FOR ROTARY TABLE, AND WAFER ROTATING AND HOLDING DEVICE

(71) Applicant: MIMASU SEMICONDUCTOR INDUSTRY CO., LTD., Gunma (JP)

(72) Inventors: Osamu Yoshida, Gunma (JP); Masaki Tamura, Gunma (JP); Hideaki Nagai, Gunma (JP)

(73) Assignee: Mimasu Semiconductor Industry Co., LTD., Gunma (JP)

( * ) Notice: Subject to any disclaimer, the term of this patent is extended or adjusted under 35 U.S.C. 154(b) by 214 days.

(21) Appl. No.: 16/304,385

(22) PCT Filed: May 18, 2017

(86) PCT No.: PCT/JP2017/018696
§ 371 (c)(1),
(2) Date: Nov. 26, 2018

(87) PCT Pub. No.: WO2017/204083
PCT Pub. Date: Nov. 30, 2017

(65) Prior Publication Data
US 2019/0295866 A1 Sep. 26, 2019

(30) Foreign Application Priority Data
May 26, 2016 (JP) .............................. JP2016-105591

(51) Int. Cl.
*H01L 21/67* (2006.01)
*H01L 21/687* (2006.01)
(Continued)

(52) U.S. Cl.
CPC .... *H01L 21/67109* (2013.01); *G03F 7/70716* (2013.01); *H01L 21/027* (2013.01);
(Continued)

(58) Field of Classification Search
CPC ... H01L 21/027; H01L 21/304; H01L 21/324; H01L 21/67103; H01L 21/67109;
(Continued)

(56) References Cited

U.S. PATENT DOCUMENTS

| 2005/0011441 | A1* | 1/2005 | Kannan ............. H01L 21/68757 118/715 |
| 2009/0032498 | A1* | 2/2009 | Tsuchiya ............. H01L 21/6708 216/92 |
| 2015/0325466 | A1* | 11/2015 | Wang .................. H01L 21/6875 279/3 |
| 2019/0006209 | A1* | 1/2019 | Wieser .................... F25B 21/02 |

FOREIGN PATENT DOCUMENTS

| EP | 3 420 782 A1 | 1/2019 |
| JP | H06232047 A | 8/1994 |

(Continued)

OTHER PUBLICATIONS

JP 2009135201 Machine Translation (Year: 2009).*
JP 2001148414 Machine Translation (Year: 2001).*

*Primary Examiner* — Lee D Wilson
*Assistant Examiner* — Alberto Saenz
(74) *Attorney, Agent, or Firm* — McGlew and Tuttle, P.C.

(57) ABSTRACT

Provided are a wafer heating and holding mechanism for a rotary table, a wafer heating method for a rotary table, and a wafer rotating and holding device with which a wafer put on a rotary table can be heated while being rotated stably under a state in which an in-plane temperature distribution of the wafer is maintained. The wafer heating and holding mechanism for a rotary table of a wafer rotating and holding device comprises: a rotary shaft; a rotary table placed on an end of the rotary shaft and configured to hold a wafer on an upper surface of the rotary table; a drive motor configured to supply motive power to the rotary shaft; and a heater provided above the rotary table and below the wafer while avoiding contact with the wafer to heat the wafer.

15 Claims, 3 Drawing Sheets

(51) Int. Cl.
  *H05B 6/10* (2006.01)
  *G03F 7/20* (2006.01)
  *H01L 21/324* (2006.01)
  *H05B 6/06* (2006.01)
  *H01L 21/027* (2006.01)
  *H01L 21/304* (2006.01)

(52) U.S. Cl.
  CPC .......... *H01L 21/304* (2013.01); *H01L 21/324* (2013.01); *H01L 21/67103* (2013.01); *H01L 21/68764* (2013.01); *H05B 6/06* (2013.01); *H05B 6/107* (2013.01)

(58) Field of Classification Search
  CPC . H01L 21/68764; G03F 7/70716; H05B 6/06; H05B 6/107
  USPC .................................. 269/281.1, 289 R, 903
  See application file for complete search history.

(56) References Cited

FOREIGN PATENT DOCUMENTS

| | | | |
|---|---|---|---|
| JP | H11-121384 A | | 4/1999 |
| JP | 2001148414 A | * | 5/2001 |
| JP | 2002-184750 A | | 6/2002 |
| JP | 2004-72000 A | | 3/2004 |
| JP | 2007-335709 A | | 12/2007 |
| JP | 4111479 B2 | | 7/2008 |
| JP | 4257816 B2 | | 4/2009 |
| JP | 2009-135201 A | | 6/2009 |
| JP | 2009135201 A | * | 6/2009 |
| JP | 4364242 B2 | | 11/2009 |
| JP | 2010087197 A | | 4/2010 |
| JP | 4625495 B2 | | 2/2011 |
| JP | 2014-090168 A | | 5/2014 |
| JP | 2014096612 A | | 5/2014 |

* cited by examiner

WAFER HEATING AND HOLDING MECHANISM AND METHOD FOR ROTARY TABLE, AND WAFER ROTATING AND HOLDING DEVICE

TECHNICAL FIELD

The present invention relates to a wafer heating and holding mechanism and method for a rotary table of a wafer rotating and holding device, and to a wafer rotating and holding device.

BACKGROUND ART

Hitherto, in semiconductor manufacturing processes, there are an increasing number of steps (also called "spin processes") in which various kinds of processing are performed while a semiconductor wafer made of, for example, silicon is rotated, such as spin etching, spin drying, and spin coating. As specific devices, there are known wafer rotating and holding devices such as a spin etching device, a spin drying device, and a spin coating device. Further, as examples of processing to be performed on a wafer surface in manufacturing processes for a device, there can be given, in addition to etching processing for removing a damaged layer after back-grinding, applying developer to the wafer, developing processing on the wafer, which has a surface that has circuit patterns exposed thereon and is applied with developer, and which is printed with a semiconductor circuit, cleaning the wafer surface, and the like. As such a wafer rotating and holding device and method used for performing spin processing on a wafer, there are given, for example, devices and methods described in Patent Documents 1 to 4.

Spin processing of the related art uses, as a way to heat a wafer substrate put on a rotary table, a method in which an etchant or a different processing solution is heated with heating means so that the wafer temperature is maintained at a spin etching processing point. In Patent Document 1, there is disclosed another method, in which an upper surface of a wafer supported by and fixed to an upper surface of a spin table is heated indirectly with the use of hot air by air hot jet means or similar heating means provided lateral to and above the wafer. Those methods of the related art, however, have poor efficiency and low precision in the heating of the wafer substrate, and consequently tend to invite unstable etching distribution. Further, stable processing is hindered by the influence of the temperature of a chemical solution, blowing for preventing the chemical solution from running over to the rear side, ventilation for removing the atmosphere of the chemical solution, and other factors. In addition, although it is possible to accomplish the balance among all, it is difficult to maintain the balance. For instance, there is a problem in that, when etching processing is performed with an etchant containing 50% of HF whose temperature is raised to approximately 40° C. in order to speed up the removal of $SiO_2$, the HF concentration drops due to evaporation simply by maintaining the raised temperature even while the processing is not performed, and the processing time is prolonged as a result.

PRIOR ART DOCUMENTS

Patent Documents

Patent Document 1: JP 4625495 B2
Patent Document 2: JP 4111479 B2
Patent Document 3: JP 4257816 B2
Patent Document 4: JP 4364242 B2

SUMMARY OF THE INVENTION

Problems to be Solved by the Invention

The present invention has been made in view of the related art described above, and an object of the present invention is to provide a wafer heating and holding mechanism for a rotary table, a wafer heating method for a rotary table, and a wafer rotating and holding device with which a wafer put on a rotary table can be heated while being rotated stably under a state in which an in-plane temperature distribution of the wafer is maintained.

Means for Solving Problems

In order to solve the above-mentioned problems, a wafer heating and holding mechanism for a rotary table according to the present invention is a wafer heating and holding mechanism for a rotary table of a wafer rotating and holding device, and comprises: a rotary shaft; a rotary table placed on an end of the rotary shaft and configured to hold a wafer on an upper surface of the rotary table; a drive motor configured to supply motive power to the rotary shaft; and heating means provided above the rotary table and below the wafer while avoiding contact with the wafer to heat the wafer.

It is preferred that the wafer heating and holding mechanism for a rotary table further comprises a reflective board provided between the rotary table and the heating means.

Although a method of supplying electric power to the heating means is not particularly limited, it is preferred that the wafer heating and holding mechanism for the rotary table use a contactless electric power supply mechanism for a rotary table comprising: a fixed-side primary coil wound around the rotary shaft; an electric power supply source connected to the fixed-side primary coil; a rotary table-side secondary coil, which is provided so as to correspond to the fixed-side primary coil and be separated from the fixed-side primary coil by a predetermined distance, and is mounted to the rotary table; and a load connected to the rotary table-side secondary coil, and that the heating means be supplied with electric power via the rotary table-side secondary coil by electromagnetic induction.

A wafer heating method for a rotary table according to the present invention comprises heating the wafer by using the above-mentioned wafer heating and holding mechanism for the rotary table.

A wafer rotating and holding device according to the present invention comprises the above-mentioned wafer heating and holding mechanism for the rotary table.

It is preferred that the wafer rotating and holding device further comprises a spin processing mechanism.

Advantageous Effects of the Invention

According to one embodiment of the present invention, there is provided a remarkable effect of enabling provision of the wafer heating and holding mechanism for a rotary table, the wafer heating method for a rotary table, and the wafer rotating and holding device with which a wafer put on a rotary table can be heated while being rotated stably under a state in which the in-plane temperature distribution of the wafer is maintained. According to the present invention, a wafer is heated directly, and hence the wafer is hardly subjected to external influence and can therefore be etched stably.

MODES FOR CARRYING OUT THE INVENTION

An embodiment of the present invention is described below, but the embodiment is described as an example, and hence it is to be understood that various modifications may be made thereto without departing from the technical idea of the present invention. In addition, the same members are denoted by the same reference symbols.

Figure 1:
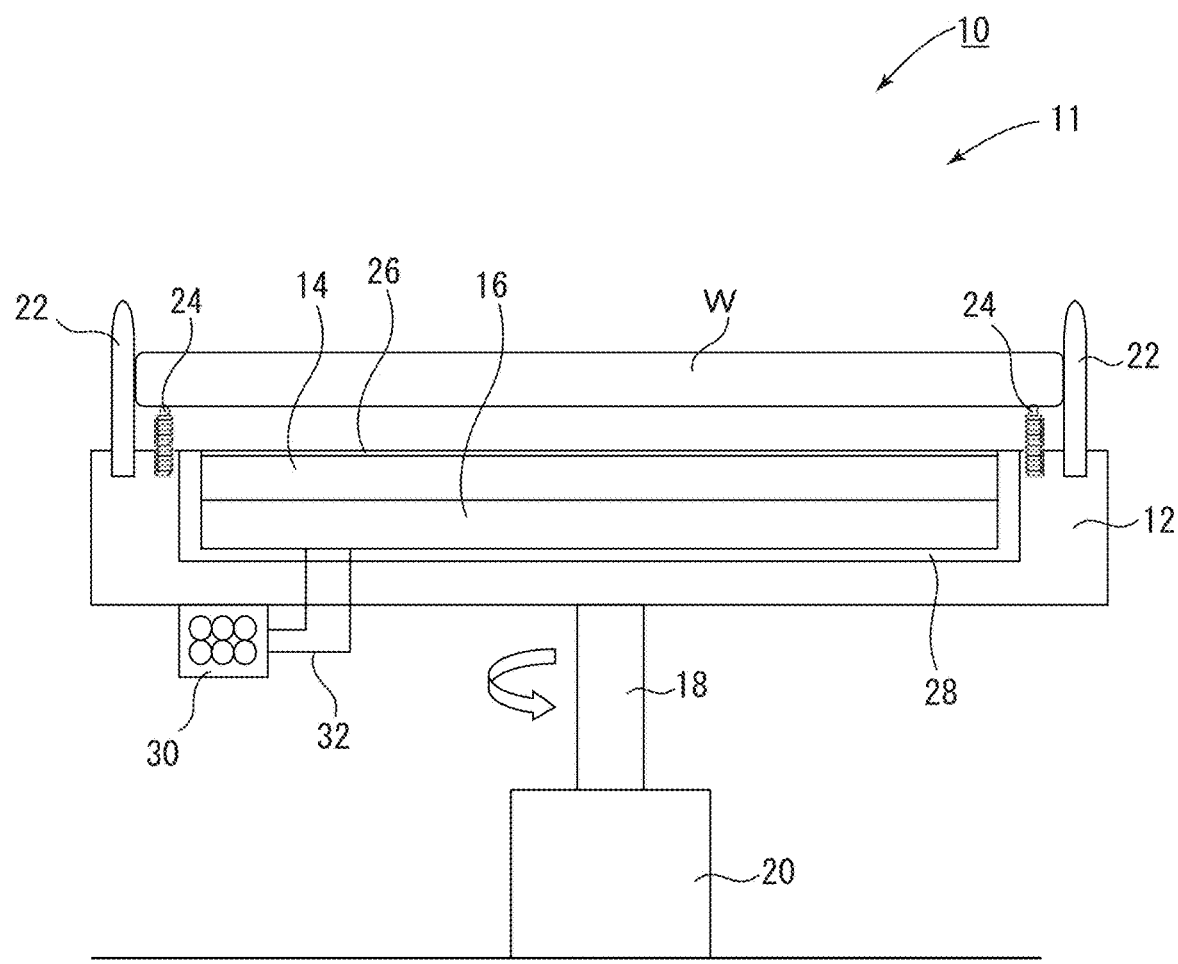
FIG. 1 is a schematic diagram of one embodiment of a wafer rotating and holding device comprising a wafer heating and holding mechanism for a rotary table according to the present invention.

In FIG. 1, a wafer heating and holding mechanism for a rotary table according to the present invention is denoted by a reference symbol 10. The wafer heating and holding mechanism 10 for the rotary table is a wafer heating and holding mechanism for a rotary table of a wafer rotating and holding device 11, and comprises: a rotary shaft 18; a rotary table 12 placed on an end of the rotary shaft 18 and configured to hold a wafer W on an upper surface of the rotary table 12; a drive motor 20 configured to supply motive power to the rotary shaft 18; and heating means 14 provided above the rotary table 12 and below the wafer W without being in contact with the wafer W to heat the wafer W. In the present invention, the heating means 14 is disposed between the rotary table 12 and the wafer W to heat the wafer W directly while avoiding contact between the heating means 14 and the wafer W. It is therefore possible to cause the temperature of the wafer W alone to rise, to thereby heat the wafer W efficiently under reduced external influence. As a result, it is possible to perform spin processing under a state in which an in-plane temperature distribution is maintained.

In FIG. 1, a reflective board is denoted by a reference symbol 16. As illustrated in FIG. 1, it is preferred for the wafer heating and holding mechanism 10 for the rotary table to comprise the reflective board 16 and to dispose the heating means 14 on the reflective board 16 so that heat is not transmitted to the rotary table 12. It is also preferred to provide a space between the reflective board 16 and the rotary table 12 with the use of a spacer 28. A resin sheet 26 is preferred to be provided on the heating means 14 in order to prevent liquids from coming into contact with the heating means 14. A synthetic resin sheet, for example, a fluororesin sheet, is a preferred resin sheet. The resin sheet used in FIG. 1 is a PFA sheet.

Figure 2:
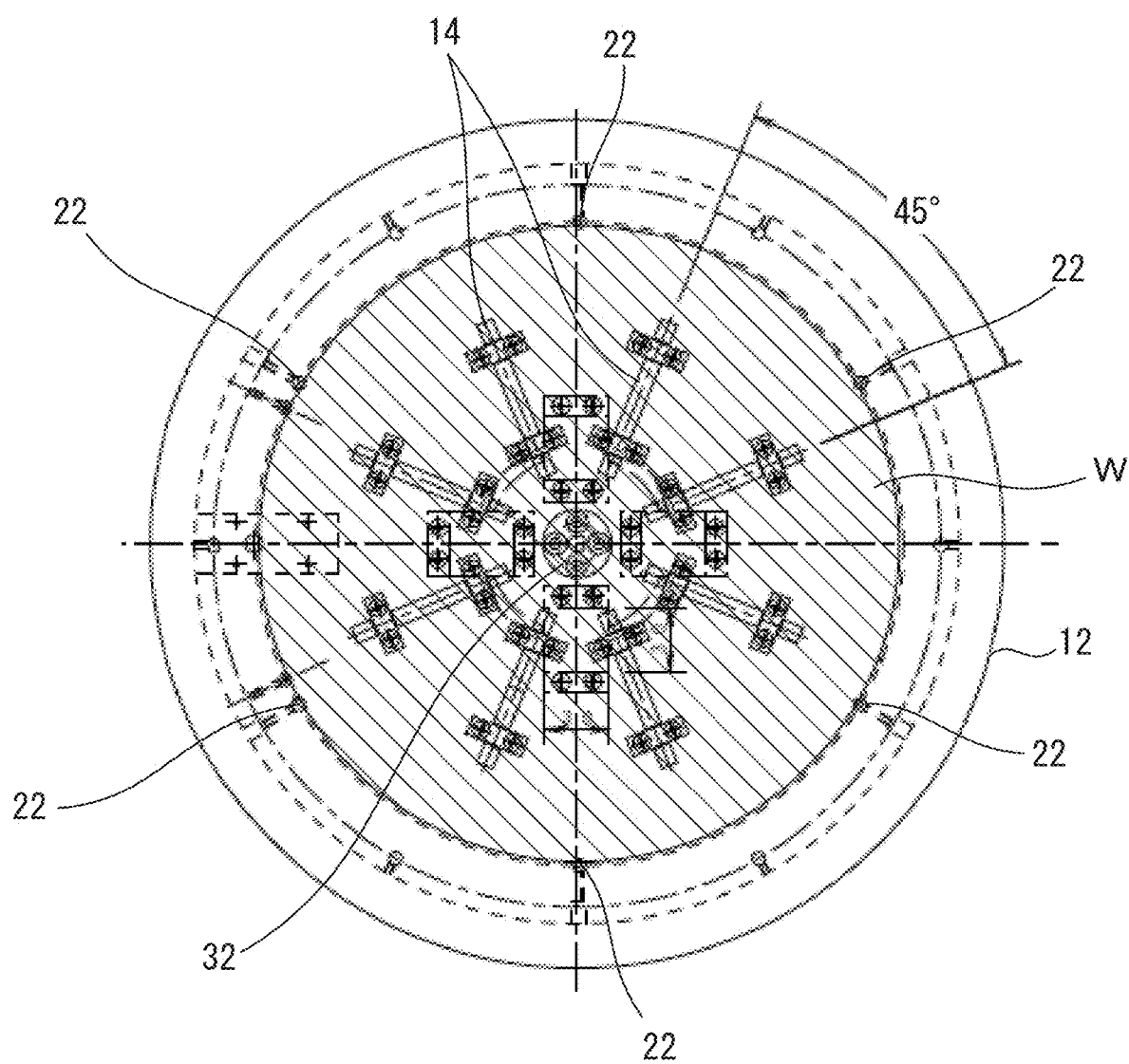
FIG. 2 is an enlarged view of a main part of the wafer rotating and holding device comprising the wafer heating and holding mechanism for the rotary table according to the present invention.

The heating means 14 is not particularly limited and can be a known heater. A preferred heater is a carbon heater or a halogen heater, for example. There is no particular limitation on how the heating means 14 is disposed in the rotary table 12, but it is preferred to provide a plurality of heaters 14 evenly. It is further preferred to provide a plurality of heaters 4 in a radial pattern, a swirl pattern or a donut pattern. An example in which eight 150-watt heaters 14 are provided evenly in a radial pattern is illustrated in FIG. 2.

Figure 3:
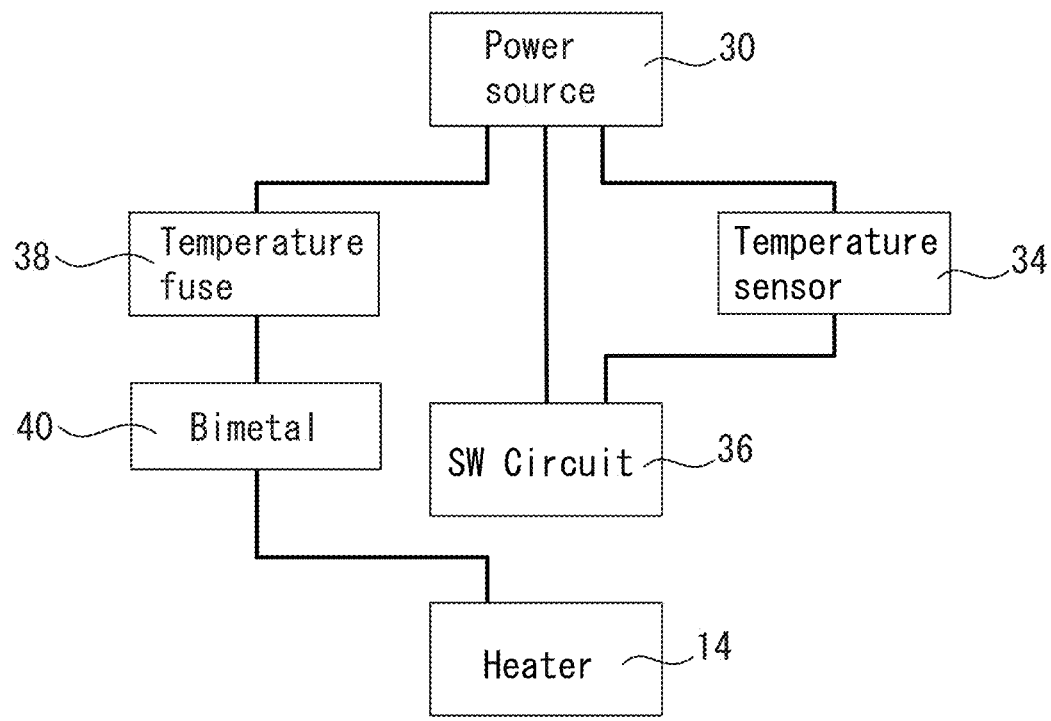
FIG. 3 is a block diagram of a heating mechanism of the wafer heating and holding mechanism for the rotary table according to the present invention.

FIG. 3 is a block diagram of a heating mechanism in the wafer heating and holding mechanism for the rotary table according to the present invention. The temperature of the wafer W is detected with a temperature sensor 34 constantly while current from a power source 30 is applied. The wafer W is rotated, and the heating means 14, which is a heater or the like, is powered on with the use of a SW circuit 36 to start heating by the heating means 14. A signal received from the temperature sensor 34 is used to control the powering on/off of the heater 14 with the SW circuit 36. Other than the SW circuit 36, a temperature fuse 38 and a bimetal 40 may be used to control the powering on/off of the heating means 14.

In FIG. 1, outer peripheral pins, which support the outer periphery of the wafer, are each denoted by a reference symbol 22 and support pins, which support a lower surface of the wafer W, are each denoted by a reference symbol 24. It is preferred to configure at least one of the outer peripheral pins 22 as a movable pin, which can be moved so as to open and close when the wafer is set.

In the illustrated example, the rotary shaft 18 is made of stainless steel (SUS), and the rotary table 12 is made of industrial plastic or other types of synthetic resin. The number of revolutions of the rotary table 12 is not particularly limited, but 100 rpm to 1,000 rpm is preferred. A silicon wafer is preferred as the wafer W.

There is no particular limitation on how electric power is supplied to the heating means 14. However, it is preferred to supply required electric power to the heating means disposed above the rotary table from a power source built in the rotary table. As methods of supplying electric power, there can be given, for example, one in which electric power is supplied from a battery embedded in the rotary table and motor driving is switched with a centrifugal force obtained by rotating the rotary table, one in which electric power is supplied from the rotary shaft by utilizing a slip ring to start rotation at the same time as electric power feeding, and one in which electric power is supplied to the rotary table with the use of electromagnetic induction to start rotation at the same time as electric power feeding. In FIG. 1, electric power is supplied to the heating means 14 from a power source provided in a lower part of the rotary table 12, via electric wires 32.

Figure 4:
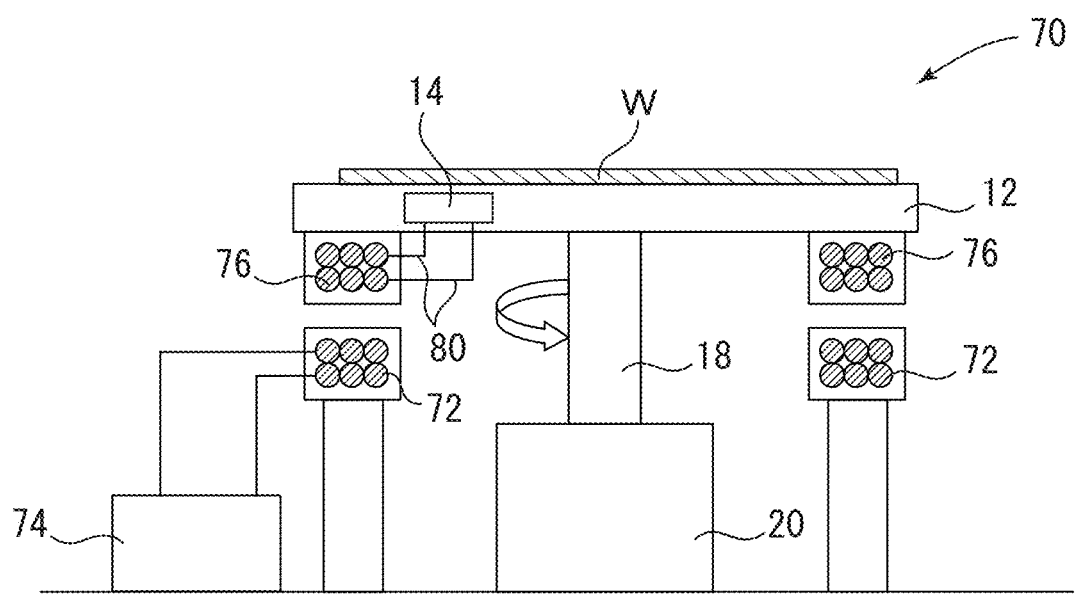
FIG. 4 is a schematic diagram for illustrating a mode of carrying out an electric power supply mechanism, which can be used in the wafer holding mechanism for the rotary table according to the present invention.

An electric power supply mechanism 70 is illustrated in FIG. 4 as a mode of carrying out electric power supply means that uses the method of using the electromagnetic induction. The electric power supply mechanism 70 in FIG. 4 comprises: the rotary shaft 18; the rotary table 12 placed on an end of the rotary shaft 18 and configured to hold the wafer W on the upper surface of the rotary table 12; the drive motor 20 configured to supply motive power to the rotary shaft 18; a fixed-side primary coil 72 wound around the rotary shaft 18; an electric power supply source 74 connected to the fixed-side primary coil 72; and a rotary table-side secondary coil 76, which is provided so as to correspond to the fixed-side primary coil 72 and be separated from the fixed-side primary coil 72 by a predetermined distance, and is mounted to the rotary table 12. A rotation control motor is connected to the rotary table-side secondary coil 76 via electric wires 80 so that electric power is supplied to the heating means 14 by electromagnetic induction via the secondary coil 76.

It is preferred for the wafer rotating and holding device according to the present invention to comprise a spin processing mechanism. The spin processing mechanism is, for example, an etching processing mechanism in a spin etching device, a drying mechanism in a spin drying device, or a coating mechanism in a spin coating device. As other spin processing mechanisms, there can be given, as processing to be performed on a wafer surface in manufacturing processes for a device, in addition to the etching processing mechanism for removing a damaged layer after back-grinding, a mechanism for applying developer to the wafer, a mechanism for performing developing processing on the wafer, which has a surface that has circuit patterns exposed thereon and is applied with developer, and which is printed with a semiconductor circuit, and a mechanism for cleaning the wafer surface, and the like. Chemical solutions to be used in the processing are not particularly limited, and acid-based/alkaline-based etching cleaning liquids and rinse water can be suitably used.

In the present invention, a wafer substrate is heated directly and constantly during spin processing by heating means disposed between the rotary table and the wafer substrate, with the result that it is possible to perform stable spin processing under a state in which the in-plane temperature distribution is maintained. Etching can be performed under reduced external influence because of the direct heating of the wafer. For instance, when $SiO_2$ is to be removed with an HF etchant and the etchant is supplied at room temperature without being heated, the HF etchant is heated on the wafer by heating the wafer directly, and the etching rate thereof is raised as a result. This lessens the deterioration of HF etchant and prolongs the life thereof. According to the present invention, the risk of using HF, which is highly volatile and thus dangerous at a raised temperature, is reduced as well.

A wafer heating method for a rotary table according to the present invention is a method of heating a wafer with the use of the wafer heating and holding mechanism for the rotary table. The wafer rotating and holding device is a device comprising the wafer heating and holding mechanism for the rotary table.

REFERENCE SIGNS LIST

10: wafer heating and holding mechanism for rotary table according to the present invention, 11: wafer rotating and holding device according to the present invention, 12, 32: rotary table, 14: heating means, heater, 16: reflective board, 18: rotary shaft, 20: drive motor, 22: outer peripheral pin, 24: support pin, 26: resin sheet, 28: spacer, 30: power source, 32: electric wire, 34: temperature sensor, 36: SW circuit, 38: temperature fuse, 40: bimetal, 70: electric power supply mechanism, 72: fixed-side primary coil, 74: electric power supply source, 76: rotary table-side secondary coil, W: wafer

The invention claimed is:

1. A heating and holding mechanism for a wafer, the mechanism comprising:
a rotary shaft with an end;
a rotary table arranged on said end of said rotary shaft, said rotary table having an upper surface defining a recess with sides, said rotary table including a first plurality of pins extending from said upper surface, said first plurality of pins being configured to support the wafer at a spaced distance from said upper surface,
a second plurality of pins extending from said upper surface, said second plurality of pins being configured to surround a circumference of the wafer;
a drive motor configured to supply motive power to said rotary shaft; and
a heater arranged in said recess of said rotary table and configured to heat the wafer supported by the first and second plurality of pins, said first plurality of pins being configured to support the wafer at a spaced distance from said heater, said heater being spaced from said sides of said recess.

2. The heating and holding mechanism according to claim 1, further comprising a reflective board provided between the rotary table and the heater.

3. The heating and holding mechanism according to claim 2, further comprising:
a contactless electric power supply mechanism for the rotary table, the contactless electric power supply mechanism comprising:
fixed-side primary coil wound around the rotary shaft;
an electric power supply source connected to the fixed-side primary coil;
a rotary table-side secondary coil provided so as to correspond to the fixed-side primary coil and separated from the fixed-side primary coil by a distance, the rotary table-side secondary coil being mounted to the rotary table; and
a load connected to the rotary table-side secondary coil, wherein the heater is supplied with electric power via the rotary table-side secondary coil by electromagnetic induction.

4. The heating and holding mechanism according to claim 1, further comprising:
a contactless electric power supply mechanism for the rotary table, the contactless electric power supply mechanism comprising:
a fixed-side primary coil wound around the rotary shaft;
an electric power supply source connected to the fixed-side primary coil;
a rotary table-side secondary coil provided so as to correspond to the fixed-side primary coil and separated from the fixed-side primary coil by a distance, the rotary table-side secondary coil being mounted to the rotary table; and
a load connected to the rotary table-side secondary coil, wherein the heater is supplied with electric power via the rotary table-side secondary coil by electromagnetic induction.

5. The mechanism in accordance with claim 1, wherein: one pin of said second plurality of pins is configured to be movable so as to open and close when the wafer is set.

6. The mechanism in accordance with claim 1, wherein: said heater is arranged spaced from said rotary table.

7. The mechanism in accordance with claim 6, further comprising:
a reflective board arranged between said heater and said rotary table.

8. The mechanism in accordance with claim 7, wherein: said reflective board is spaced from said rotary table.

9. The mechanism in accordance with claim 1, wherein: said recess has a bottom;
a spacer is arranged between said heater and said bottom of said recess, said spacer spacing said heater from said bottom of said recess.

10. The mechanism in accordance with claim 1, wherein: said heater is arranged at a side of said rotary table having said upper surface.

11. A wafer heating method for a rotary table, the method comprising:
   heating a wafer by a wafer heating and holding mechanism for the rotary table, the wafer heating and holding mechanism comprising:
      a rotary shaft, the rotary table placed on an end of the rotary shaft and the rotary table having an upper surface defining a recess with sides, the rotary table including a first plurality of pins extending from the upper surface, the first plurality of pins being configured to support the wafer at a spaced distance from the upper surface, a second plurality of pins extending from the upper surface, the second plurality of pins being configured to surround a circumference of the wafer;
      a drive motor configured to supply motive power to the rotary shaft; and
      a heater provided above the rotary table and below the wafer while avoiding contact with the wafer, the heater being configured to heat the wafer, the heater being spaced from the sides of the recess.

12. The wafer heating method according to claim 11, further comprising providing a reflective board provided between the rotary table and the heater.

13. The wafer heating method according to claim 12, further comprising:
   providing a contactless electric power supply mechanism for the rotary table, the contactless electric power supply mechanism comprising:
      a fixed-side primary coil wound around the rotary shaft;
      an electric power supply source connected to the fixed-side primary coil;
      a rotary table-side secondary coil provided so as to correspond to the fixed-side primary coil and separated from the fixed-side primary coil by a distance, the rotary table-side secondary coil being mounted to the rotary table; and
      a load connected to the rotary table-side secondary coil, wherein the heater is supplied with electric power via the rotary table-side secondary coil by electromagnetic induction.

14. A wafer heating method according to claim 11, further comprising:
   providing a contactless electric power supply mechanism for the rotary table, the contactless electric power supply mechanism comprising:
      a fixed-side primary coil wound around the rotary shaft;
      an electric power supply source connected to the fixed-side primary coil;
      a rotary table-side secondary coil provided so as to correspond to the fixed-side primary coil and separated from the fixed-side primary coil by a distance, the rotary table-side secondary coil being mounted to the rotary table; and
      a load connected to the rotary table-side secondary coil, wherein the heater is supplied with electric power via the rotary table-side secondary coil by electromagnetic induction.

15. The wafer heating method according to claim 11, wherein:
   the recess has a bottom;
   a spacer is arranged between the heater and the bottom of the recess, the spacer spacing the heater from the bottom of the recess.

* * * * *